United States Patent
Haynes et al.

(10) Patent No.: US 7,427,867 B2
(45) Date of Patent: Sep. 23, 2008

(54) METHOD AND SYSTEM FOR NON-DESTRUCTIVE EVALUATION OF CONDUCTING STRUCTURES

(75) Inventors: Leonard S. Haynes, Rockville, MD (US); Eric van Doorn, Frederick, MD (US)

(73) Assignee: Intelligent Automation, Inc., Rockville, MD (US)

( * ) Notice: Subject to any disclaimer, the term of this patent is extended or adjusted under 35 U.S.C. 154(b) by 17 days.

(21) Appl. No.: 11/804,252

(22) Filed: May 17, 2007

(65) Prior Publication Data

US 2007/0222457 A1    Sep. 27, 2007

Related U.S. Application Data

(63) Continuation of application No. 10/861,369, filed on Jun. 7, 2004, now abandoned.

(51) Int. Cl.
*G01R 27/02* (2006.01)
*G01R 31/02* (2006.01)
*G01R 31/08* (2006.01)

(52) U.S. Cl. .................. 324/603; 324/543; 324/527
(58) Field of Classification Search .............. 324/527
See application file for complete search history.

(56) References Cited

U.S. PATENT DOCUMENTS

| | | | |
|---|---|---|---|
| 1,160,271 A | 11/1915 | Ford | |
| 3,988,667 A | 10/1976 | Roth et al. | |
| 4,067,060 A | 1/1978 | Poussart et al. | |
| 4,275,446 A | 6/1981 | Blaess | |
| 4,845,737 A | 7/1989 | Ohlendorf et al. | |
| 4,860,227 A | 8/1989 | Tamamura | |
| 4,914,394 A * | 4/1990 | Meyer | 324/534 |
| 4,935,699 A | 6/1990 | Boenning | |
| 4,988,949 A | 1/1991 | Boenning et al. | |
| 5,025,221 A | 6/1991 | Blaess | |
| 5,891,398 A | 4/1999 | Lewis et al. | |
| 6,064,212 A | 5/2000 | Arweiler et al. | |
| 6,265,880 B1 | 7/2001 | Born et al. | |
| 6,453,253 B1 | 9/2002 | Ito | |
| 6,868,357 B2 | 3/2005 | Furse | |
| 2003/0125893 A1 | 7/2003 | Furse | |
| 2003/0163264 A1 | 8/2003 | Garreau et al. | |
| 2003/0222654 A1 | 12/2003 | Furse | |
| 2004/0015311 A1 | 1/2004 | Furse et al. | |
| 2004/0039976 A1 | 2/2004 | Gunther et al. | |
| 2004/0073395 A1 | 4/2004 | Furse et al. | |

* cited by examiner

*Primary Examiner*—Andrew H Hirshfeld
*Assistant Examiner*—Jeff Natalini

(57) ABSTRACT

Method and system for non-destructive evaluation for a conducting structure by measuring the electrical impulse response thereof including applying a PRBS test input signal to the conducting structure, detecting an output signal from the conducting structure and processing the data to assess the condition of the conducting structure via changes in the electrical impulse response and to locate any defects along the conducting structure.

12 Claims, 7 Drawing Sheets

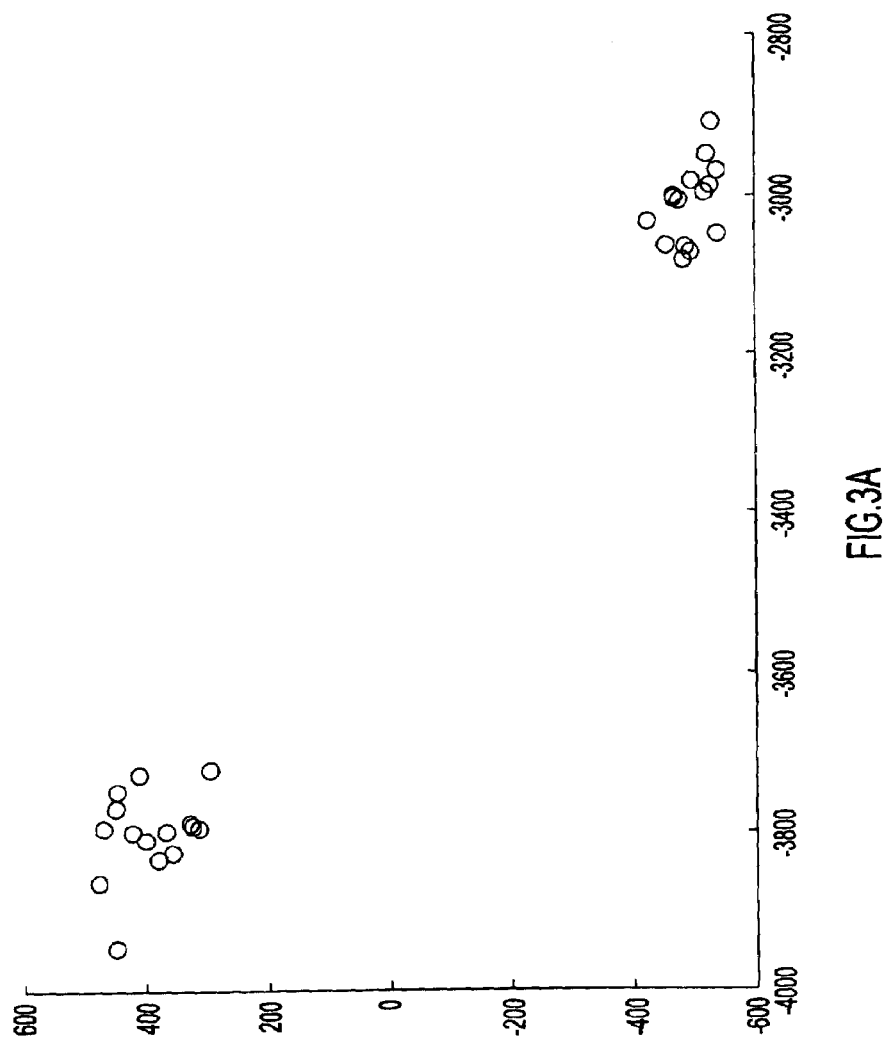

Test Circuit Response Cross Correlation Signal

METHOD AND SYSTEM FOR NON-DESTRUCTIVE EVALUATION OF CONDUCTING STRUCTURES

CROSS-REFERENCE TO RELATED PATENT APPLICATION

The subject patent application is a continuation of U.S. patent application Ser. No. 10/861,369 filed Jun. 7, 2004, now abandoned the entire disclosure of which is incorporated herein by reference.

The U.S. Government has a paid-up license in this invention and the right in limited circumstances to require the patent owner to license others on reasonable terms as provided for by the terms of Contract No. FA99456-06-M-0185 awarded by the U.S. Air Force.

BACKGROUND OF THE INVENTION

The present invention pertains to methods and systems for evaluating the structural integrity of electrically conductive structures and, more particularly, to such methods and systems wherein the electrical impulse response of the structure is measured after a test input signal is applied in order to assess the integrity of the structure and the presence, severity and location of any defects.

The prior art, as exemplified by U.S. Pat. No. 3,988,667 to Roth et al, No. 4,067,060 to Poussart et al, No. 4,275,446 to Blaess, No. 4,935,699 to Boenning, No. 4,988,949 to Boenning et al, No. 5,025,221 to Blaess, No. 6,064,212 to Ariweilar et al and No. 6,265,880 to Bornet et al and British Patent No. 1,160,271 to Booth et al, discloses the use of periodic-random, noise and pseudo-random binary sequence test input signals for measuring transfer functions of systems under test, and/or measuring transmission characteristics by Fourier analysis, and/or systems for detecting chafing of cables and/or conduits; however, the prior art does not permit implementation of high frequency evaluation for detecting subtle changes of electrical characteristics of structures to be tested or evaluated. In prior art methods for testing of servo systems, the impulse response function is compared with a set of known correct functions and any discrepancy is noted.

It is known that the cross correlation of a random noise input and the resulting output of a system is identical to the impulse response of the system. To be perfect, the random noise input would need to be infinitely long and perfectly random. In practice, a specific length, pseudo-random binary signal has been disclosed, as for example in the Booth et al British Patent No. 1,160,271, where the cross correlation function of the input with the output is generated by computing the average of the cross correlation of the output with a copy of the input delayed to generate one point on the impulse response function. An integrator is used to measure the average value of the impulse response; and, accordingly, the Booth et al system has the disadvantage of not being feasibly implemented for high frequency test signals.

SUMMARY OF THE INVENTION

The present invention overcomes the disadvantages of the prior art in non-destructive evaluation of a conducting structure by measuring the electrical impulse response thereof. The term "conducting structure" as used herein means any object or system having an electrical impulse response upon application of an electrical test signal thereto and includes, but is not limited to, cables, wires, including insulation around wires, fencing, circuits and other objects having electrical characteristics exhibiting changes, no matter how subtle, that can be detected in accordance with the present invention. Accordingly, "conducting structure" as used herein includes partially conducting structures of the type where conductivity occurs internally and/or externally of the structure. Such conducting structures may have a very high resistance relative to DC voltage such as to be essentially non-conductive to DC.

Another object of the present invention evaluates a conducting structures by applying a test signal to a convenient input point of the conducting structure and measuring an electrical impulse response at a convenient output point of the conducting structure. The output and input points can be nearly co-located facilitating use with elongated conducting structures.

In accordance with another aspect, the present invention uses a test signal of a frequency sufficiently high that the wavelength of the test signal and, thus, the skin depth of the propagating energy, is small and, further, uses a very wide-band high frequency signal, at least 3 MHz, so that there is great spectral richness in the test signal.

The present invention uses an analog multiplier to multiply a time-shifted, pseudo-random binary sequence (PRBS) input signal with an output signal from a conducting structure and samples the resulting waveshape with sampling instants asynchronous with repetition of the PRBS input signal and asynchronous with the multiplication of the time shifted input signal and the output signal.

The present invention tests conducting structures using test signals having a very large bandwidth at a high frequency and, consequently, a very small skin depth such that energy travels near the surface of the conducting structures or in the material around, including air, just outside the conducting structures, the large bandwidth creating great spectral richness in the test signal. Changes in the conducting structures near the surface cause complex patterns of multipath reflections in the conducting structures and are detectable as changes in the electrical impulse responses of the conducting structures. In this manner, the present invention can detect changes in conducting structures manifested by cracks or abrasions in wire insulation, cracks, corrosion or stress in piping or other elongated structures, such as fencing or wires or metal bands, or fluid on the surface of the conducting structures. Similarly, the present invention can be used to measure the ionic content, such as chlorine, of fluids.

An additional aspect of the present invention is to permit testing of elongated conducting structures, such as cables, wires, piping and structural members, with input and output points at the same end of the conducting structure thereby providing ease of installation and testing and reducing the output signals required for analysis as compared with the case where the input and output points are at opposite ends of the conducting structure.

Another aspect of the present invention is the use of a pseudo-random binary sequence (PRBS) where all binary values with M bits are used once and only once for an M length sequence, such a code being capable of being generated using a properly connected shift register generator. The clocking frequency of the PRBS is a high frequency, near 70 MHz in a particular embodiment; and, an analog multiplier multiplies the time shifted input signal with the output signal. The resulting waveshape is sampled with the sampling instants being asynchronous with the repetition of the PRBS and the time shifted input and output. With a 70 MHz clocking frequency, the resulting PRBS will have significant spectral content from a few MHz to several hundred MHz. The time delays (shifts) need not be smaller than the clock cycle time of PRBS for detection of defects but should be smaller than the clock cycle for the precise localization of defects.

Some of the advantages of the present invention over the prior art include use of the present invention for testing any structure which is conducting to any extent at high frequencies such as, for example, wiring, piping, fencing and circuitry, use of the present invention for testing chlorine level and pH level in water and other fluids, use of the present invention for testing for fluid leaks, such as of water and hydraulic fluids, use of test signal frequencies of a few MHz to hundreds of MHz, requiring simple, low cost hardware. Because of the high frequency of the test signals, the test signals can easily be separated from normal power frequencies (such as 60 MHz or 400 Hz) by using a simple passive filter thereby enabling built-in, on-line testing of electrical power wiring.

Each time delay t is repeated many times, and one or more samples from each repetition (asynchronous) are captured and stored. The average of the samples is then used as the impulse response function for the point t on the function. Generally, a fixed number of samples would be used such that statistically the correct average value is achieved. Because the frequency is very high, many samples can be used for each point on the impulse response function and still generate the complete impulse response function in a few milliseconds. Very subtle changes are detected in the impulse response function due to changes in multipath reflections and interference that occur over a very wide frequency range as a result of insulation defects for wire, abrasions on piping, water or hydraulic fluid on piping, etc. Since direct comparison with known normal impulse response functions would be inadequate, typical impulse response functions are processed with mathematics known as Principal Component Analysis (PCA) to generate what are known as Principal Components.

Other aspects and advantages of the present invention will become apparent from the following description of the preferred embodiments taken in conjunction with the accompanying drawings, wherein like parts in each of the several figures are identified by the same reference characters.

BRIEF DESCRIPTION OF THE DRAWINGS

FIG. 3A is a plot of features in 2D space where different colors would represent different chafing levels.

DESCRIPTION OF THE PREFERRED EMBODIMENT

It is known that cross-correlation of test input and output signals supplied to and received from a device under test contain sufficient information to evaluate the integrity of the device. It is an important feature of the present invention that the cross-correlation can be accomplished without acquiring the input and output signal voltages directly and without fast digitization of the input and output signals. To this end, in accordance with the present invention, the test input signal (or replica thereof) is delayed and supplied to an analog (voltage) multiplier along with the output signal such that the output of the multiplier represents the time-averaged correlation function for a particular input-output leg. The multiplier output can be digitized at a reduced speed due to the interest in time-averaged signals.

Figure 1:
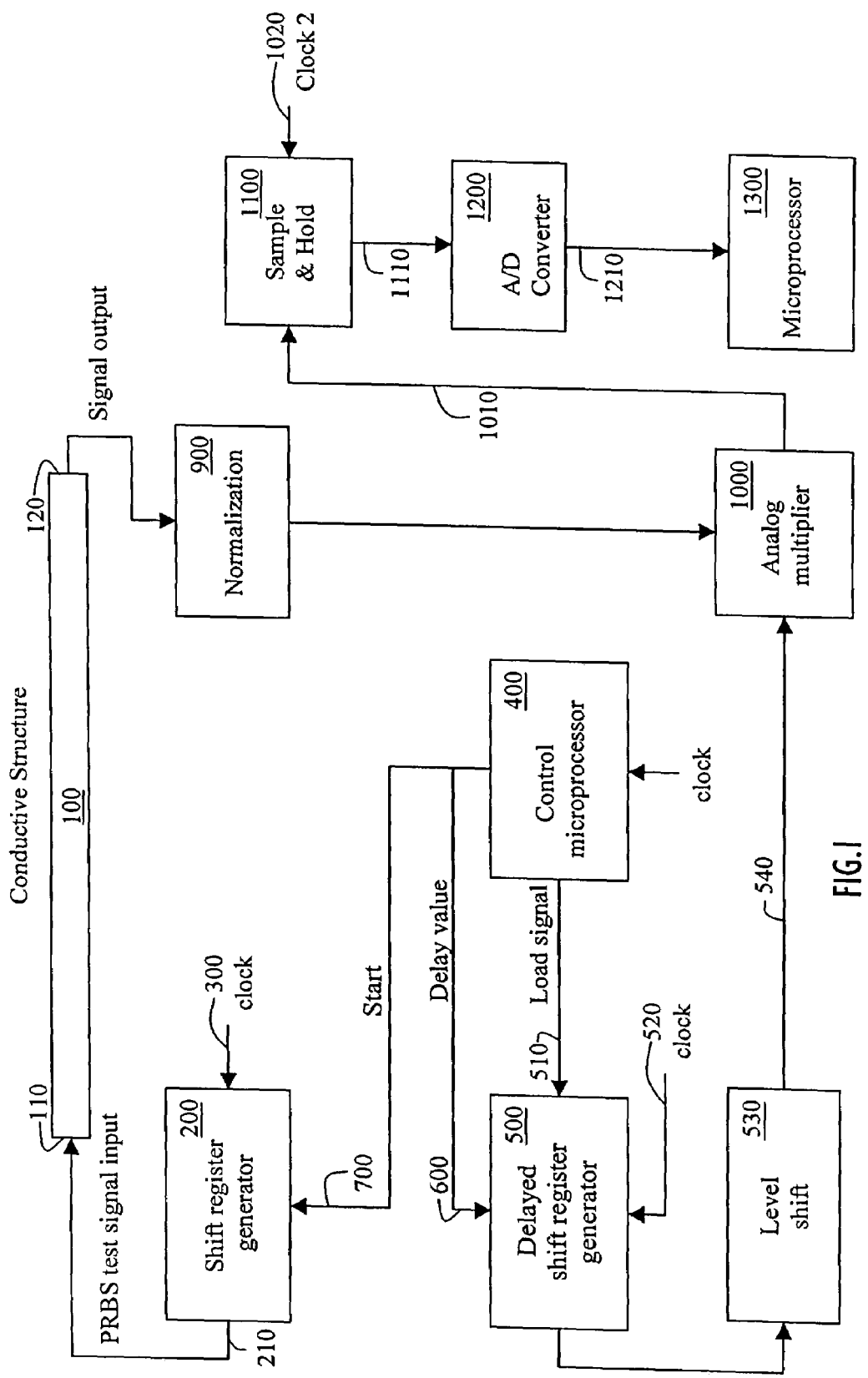
FIG. 1 is a block diagram of a system according to the present invention.

A preferred embodiment of a system according to the present invention is shown in FIG. 1 for testing a conducting structure 100 wherein a PRBS test signal is coupled with an input point 110 of the conducting structure and an output signal is taken from an output point 120 at the other end of the conducting structure. The PRBS test signal is generated by a shift register generator 200. The clock speed required is quite high, and the shift register generator is generally implemented as a hardware shift register with feedback from selected bits connected through "exclusive or" gates in the conventional manner. The exact connection of the bits of the shift register generator determine the exact sequence of bits at the output 210 and are selected to yield a perfect code with $2^n$ distinct values of the shift register's n bits for a shift register of length n. A clock signal 300 invokes each successive shift. A typical frequency for the clock in a preferred embodiment is 70 megahertz (MHz). The sequence is initialized with a start signal 700. A delayed shift register generator 500 generates a delayed bit sequence identical to that generated by shift register generator 200 except delayed in time by d clock pulses. The amount of delay is determined by a control processor 400 and can be implemented by preloading n bits into the delayed shift register generator 500 so that d clock pulses are required to get to the initial value of shift register generator 200. Control processor 400 selects the delay value from a table stored in its memory, places the delay value on the direct input port of the delayed shift register 500 and raises the load signal 510. It then gates successive clock pulses to the delayed shift register generator through clock input 520. The output of the delayed shift register generator 500 is passed to a level shift circuit 530 which shifts the level of binary signal to provide an output 540 to best match an analog multiplier 1000. Sub-chip delays (delays smaller than one clock cycle) can be achieved by using a clock multiplier with phase control, such as Texas Instruments part CDCF5801.

The output signal from the conducting structure 100 is coupled to a normalization circuit 900 which adjusts the level of the output signal to match the input signal range of the analog multiplier 1000 and results in the analog multiplier output generally remaining in its linear range and on average using a large percentage of the dynamic range of the analog multiplier. The design of normalization circuit 900 is simply accomplished since the other input 540 of the analog multiplier 1000 is a binary signal and is always either zero or a fixed voltage level. Analog multiplier 1000 operates at very high speeds and has a bandwidth at least up to 200 MHz. Even higher frequency ranges may be useful for other applications. An example of a suitable analog multiplier is the AD835 marketed by Analog Devices. The output 1010 of the analog multiplier is supplied to a sample and hold circuit 1100 controlled by a sample signal clock 2 1020 to initiate the capture and hold of whatever value was present at the instant of the signal clock 2 1020. Signal clock 2 is asynchronous and uncorrelated with the shift register generator clocks 300 and 520. Any convenient clock 2 speed can be used; but, the faster the sample and hold circuit operates, the faster results will be available.

Sample and hold output 1110 is digitized by an A/D converter circuit 1200. In the preferred embodiment, a 12 bit conversion is adequate. The digital output of the A/D converter 1210 is supplied to the input of a microprocessor 1300 for the remaining processing. It is important to understand that the A/D conversion and storage in the microprocessor does not need to occur at high speeds even though the signals of interest are as high as 200 Megahertz or even higher in other applications. The first processing step to be performed by microprocessor 1300 is to compute the average of a fixed number of samples taken from repetitions of the impulse response function. Once that number of samples has been taken, the control microprocessor 400 will initiate the next delay and begin repeating the pseudo-random sequence again, and the microprocessor 1300 will begin computing the next average value for that next delay. Alternatively, a varying number of samples can be averaged until the average converges. This has the potential to require less samples than if a fixed number of samples are used, but it adds some processing complexity. For most applications, the speed of testing is not critical, and using a fixed number of samples is simpler.

Figure 2:
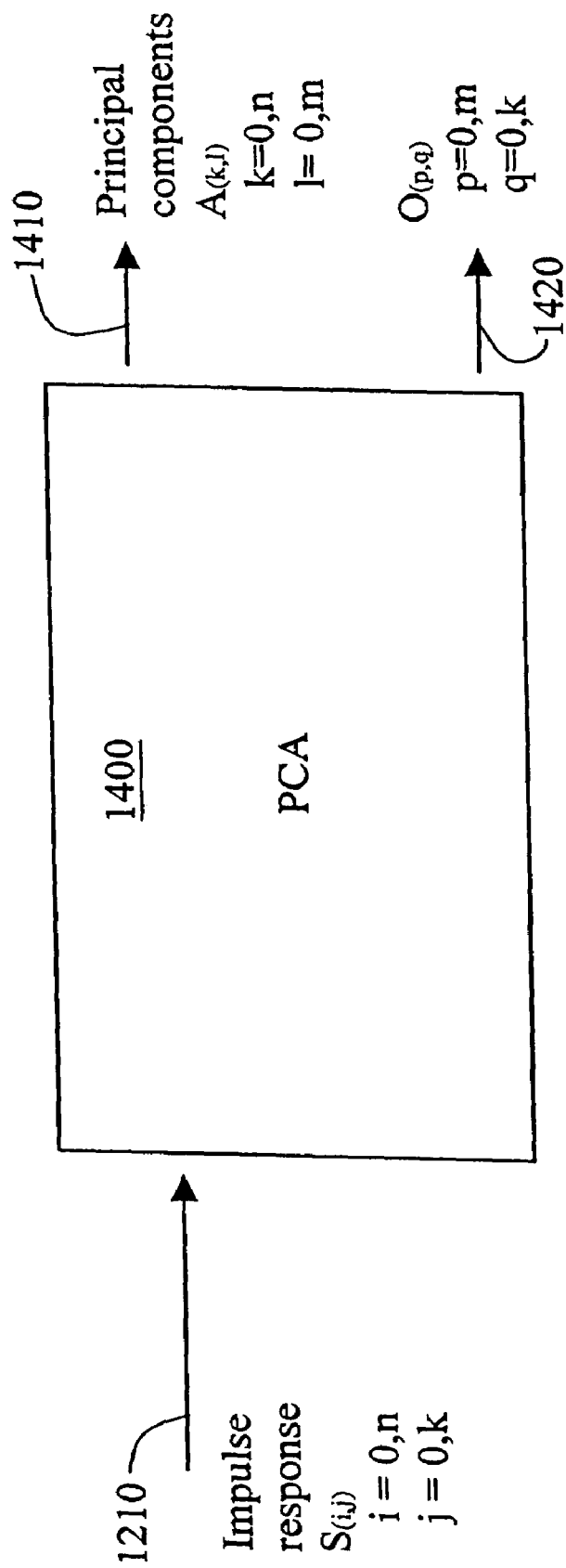
FIG. 2 illustrates the primary processing functions for implementing the system of FIG. 1.
Figure 3:
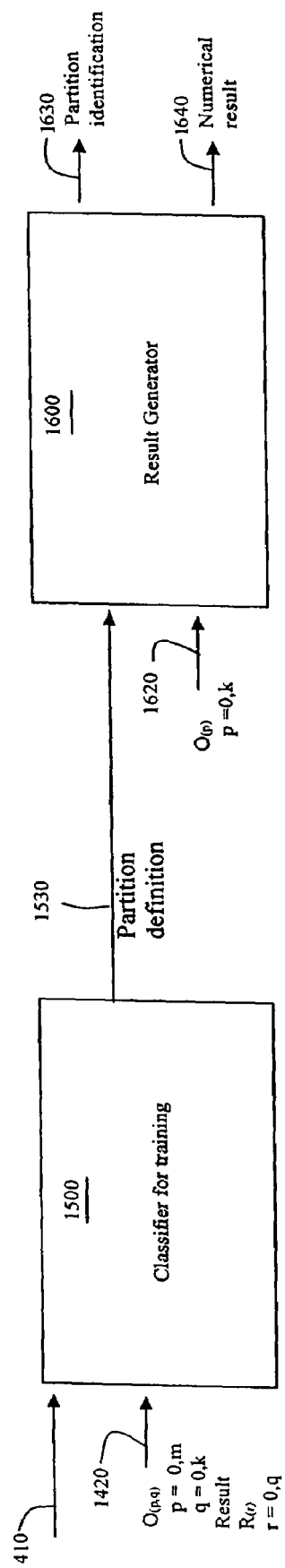
FIG. 3 illustrates the processing functions to produce identification and quantification for implementing the system of FIG. 1.

Instead of directly comparing a captured impulse response with previously stored impulse responses of a properly operating system; in accordance with a preferred embodiment of the present invention impulse response data compressed into a form which assists in change detection, quantification and diagnosis. As shown in FIGS. 2 and 3, three values are particularly important. n is the number of points per impulse response function. Typically, this would be in the range of 1000 to 5000 points per function. k is the number of traces used to characterize a given conducting structure. m is the number of principal components used in classification and result generation, i.e. n=points per impulse response, k=number of traces and m=number of principal components. As shown, the output 1210 of A/D converter 1200 supplies data to a primary component analysis (PCA) processor 1400, which data is stored in an array $S(i,j)$ i=0,n; j=0,k. $S(0,1)$ $S(1,1)$ $S(2,1)$ $S(3,1)$ . . . $S(n,1)$ is the data from the first impulse response. Each successive point i is the result of the next delay as described above. There are n such delays and hence n points in the data for $S(i,1)$. For PCA processing, k of these traces are stored in memory, indexed by index j=1,k. The PCA algorithm yields two primary results. The first result, 1410, is array $A(k,l)$ k=0,n; l=0,m. Index k is from 0 to n where n is the number of points in each trace. Index l is for each principal component. $A(0,1) A(1,1) A(2,1) A(3,1), \ldots, A(n,1)$ defines the first principal component as the weighted sum of the n points that make up the original data. The algorithm which computes the principal components selects the weights to maximize the variance in the data in a manner which can be found in most textbooks on statistics and signal processing. The first k principal components are computed. Principal components are computed when the system is known to be operating correctly, and then these components are fixed. After that time the values of A are treated as constants and applied to incoming data to generate array $O(p,q)$ as described below.

The second result, 1420, of the PCA algorithm is the array $O(p,q)$ p=0,m; q=0,k. The matrix O stores the coordinates of the incoming raw impulse response transformed into the new coordinate system defined by the matrix A. O is computed by multiplying matrix S by matrix A as shown in the following equation.

$$S(i)$$
$$i = 0, n*(Ak)$$

As shown in FIG. 3, a classifier 1500 uses the data $O(p,q)$ expressed in the reduced dimensional space generated by the PCA algorithm results 1410 and 1420. This is the output data in the coordinate system defined by the PCA algorithm and the resulting principal coordinates. It also uses as input any a priori results $R(v,w)$ v=0,m; w=0,k which classify and/or quantify known abnormal clusters as to the cause of the abnormality. The a priori results are used to help define clusters and to help quantify clusters as they relate to desired values, such as the severity of damage to the conducting structures being tested. The processing represented by the clustering algorithm of the classifier 1500 is performed off-line using nominal data acquired when the system is known good and, when feasible, data resulting from specific faults. As a generalization, the more data which can be fed into the clustering algorithm for training the better. Since this processing is done infrequently, the time it requires is unimportant. The output of the clustering algorithm is a partition definition 1530 that partitions the space defined by the PCA principal components into areas representing normal and abnormal and also representing quantification of changes. As examples, in the case of non-destructive testing of hydraulic lines, specific areas of the space may represent minor abrasion, and other areas may represent severe abrasion. The learning or training process can proceed continually allowing the system to slowly adapt to long term changes, if desirable. However, in the case of non-destructive testing, it is generally not desirable to allow the system to slowly adapt to changes since it is exactly those long term changes from the original known good system that are to be detected and diagnosed. A result generator 1600 provides on-line processing that takes as input the partition definition 1530 and the next real-time sample impulse response function 1620 represented in the PCA space and computes the distance of that point from the various nearby clusters and, from those distances, draws a final conclusion. If the data is in an abnormal cluster, the result generator identifies and quantifies the probable cause as partition identification 1630. If the new data is not in any cluster where a diagnosis is available, the system merely identifies the data as abnormal as numerical result 1640.

There follows a more detailed explanation of the mathematics and underlying science concepts and the data processing. For the purpose of ease of description, the system and method of the present invention will be described primarily in connection with wires and circuits, particularly detection of chafing of cables; however, it is understood that the system and method of the present invention can be used to test any conducting structures as defined above.

Principle component analysis (PCA) is a tool that can reduce signal dimensions so that one can visualize the data clusters very easily in 2D or 3D dimensional space. The following best illustrates the key idea of PCA.

Step 1: Form U matrix

Sample vectors from all classes → Calculate correlation matrix $R = E(xx)_T$ →

-continued

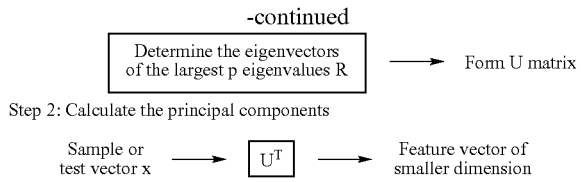

Step 2: Calculate the principal components

The most important property of PCA is its capability of dimensionality reduction. One may reduce the number of output features needed for effective data representation by discarding those linear combinations that have small variances, and retaining only those terms that have large variances. Let $\lambda_1, \ldots, \lambda_p$ be the largest m eigenvalues of the correlation matrix R. The data vector x is approximated by truncating the expansion in the above expression after p terms as follows:

$$\hat{x} = \sum_{j=1}^{p} a_j u_j, \, p < n$$

Where n is the dimension of x, $a_j$, j=1, ..., p is the projection value of x to the j-th eigenvector $u_j$, and $a_1, \ldots, a_p$ are called features of x. In many cases, p=2 or 3 are chosen so the features can be visualized in 2D or 3D space. The eigenvalues $\lambda_p, \ldots, \lambda_{n-1}$ are the smallest (n-p) eigenvalues of the correlation matrix R; they correspond to the terms discarded from the expansion of x to construct the approximating vector x'. The closer these eigenvalues are to zero, the more effective the dimensionality reduction will be.

When wire chafing is being tested, for example, data might be taken for six different levels of chafing damage. There would be six sets of test data, one for each level of chafing. The six levels would be w=0.0, w=0.06, w=0.12, w=0.24, w=0.48, w=0.96 inches, respectively, where w denotes the width of the chafed area. For each chafing level five hundred series of input and output signals would be acquired.

Thereafter, the test data would be averaged within each test set or chafing level. Because of measurement noise and other unknown factors, using only one individual measurement signal may not reveal the real dynamic relationship between the acquired input and output signals. Therefore, filtering techniques would be used to mitigate the noise impact as well as the effects caused by other unknown uncertainties. For each chafing level, five hundred pairs of input and output signals would be acquired with each signal containing five hundred data points.

Using the first input voltage time series as a reference, the time lag of subsequent time series is determined by means of a cross-correlation operation. In this way, all five hundred time series can be "lined up" for both input and output voltages. After the signals are acquired and saved to data files, they are evenly divided into five groups. Each group has one hundred input and one hundred output signals. For each chafing level, five averaged pairs of input and output signals result.

Performing a cross correlation operation on the averaged data signals, the outputs will be 30 column vectors, $x_i \in R^{999}$, i=1, ..., 30.

Let $X=[x_1, x_2, \ldots, x_{30}]$ and $R=X^T X$. Find two principal eigenvectors, $u_i \in R^{999}$, i=1,2, of R, that correspond to the two largest eigenvalues of R.

Project $x_i$, i=1, ..., 30, to the two principal eigenvectors to obtain a set of features with each feature vector containing two values.

Plot the features in 2D space, i.e. feature space. The result is shown in FIG. 3A where different colors would represent different chafing levels.

Levels one (normal case, unchafed wire), two and three are grouped together, and levels four, five and six are also grouped together. Basically, this reveals that when the chafing level is below 0.12 inches, the PCA can hardly detect the anomaly. However, when the chafing level exceeds 0.24 inches, the PCA features are very distinct from ones with no chafing. Furthermore, a large chafing amount, for example, 0.96 inches, doesn't push the PCA features further away from the normal cluster.

Instead of averaging the raw input and output signal, averaging can be performed after the correlation. Numerically, this will increase the computation complexity. However, averaging after the correlation is, practically, a better approach as there are many commercial off-the-shelf hardware correlators available, some with averaging functions.

For practical applications, the injection (input) and detection (output) of the PRBS probe signal can take place close together, so that only one access point is needed to inspect an entire wire.

In accordance with the present invention, a small PRBS input signal is injected into the conducting structure, such as a cable, and the cable's distortion due to changes in the wire characteristics is studied. Very low level PRBS signals can be added to normal cable inputs, and a complete characterization of the cable can be obtained while the cable is performing its usual task in that the PRBS signal can be sufficiently low level to not affect nominal cable operation. The output at the test point is then averaged through many probe (PRBS input signal) sequences to obtain the desired impulse response. Since the testing can be fully built-in and on-line, the time required to complete the averaging is unimportant. The approach can also be used to test cables off-line where the cables are not carrying other signals during the test.

The system of the present invention can be easily implemented on a single integrated circuit and can be used to perform constant on-line prognostic characterization of cables. Because it can be implemented on a single IC, it is fully feasible for built-in test applications. Microprocessors are available that include integral A/D converters, read-only, and writable memory. With these components, it is quite feasible that only a single microprocessor is necessary to implement the present invention.

Figure 4:
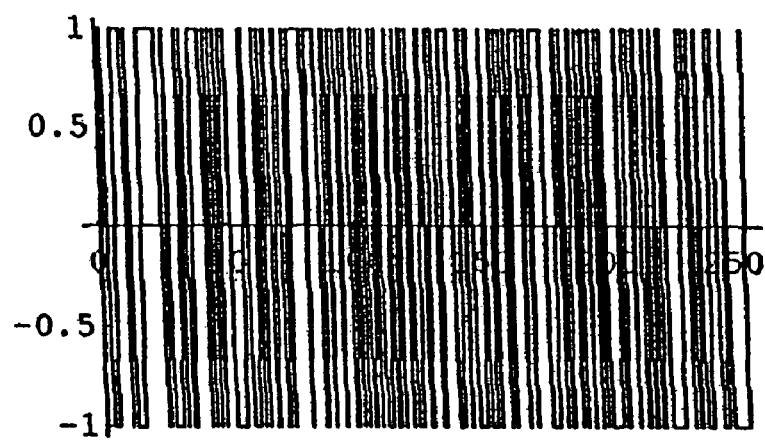
FIG. 4 shows a typical PRBS signal for use with the present invention.
Figure 5:
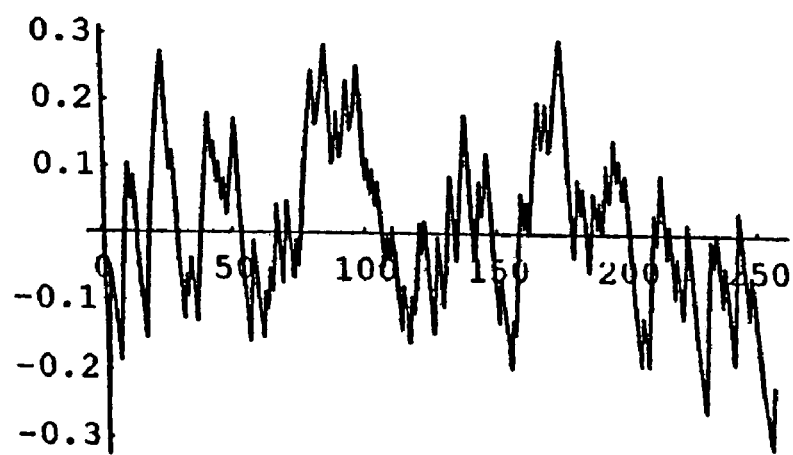
FIG. 5 shows the output from a system receiving the PRBS signal of FIG. 4 as an input.

As noted above, a PRBS signal is applied to the input of any conducting structure, such as a circuit or cable, as a test-probe, the PRBS being a waveform of binary pulses which can be of varying (but precisely-determined) numbers of pulses with different durations and positions in the sequence. A typical PRBS waveform consists of 255 pulses applied in about 25 msec and is shown in FIG. 4. When the PRBS signal is inserted into the input of a circuit such as an inverting op-amp with a DC gain of −4.7, and a parallel RC circuit in the feedback loop, the result at the output is shown in FIG. 5.

Figure 6:
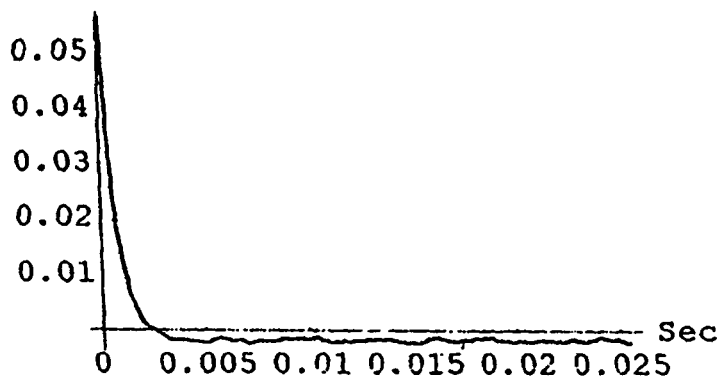
FIG. 6 shows an impulse response function derived from the waveform of FIG. 5.
Figure 7:
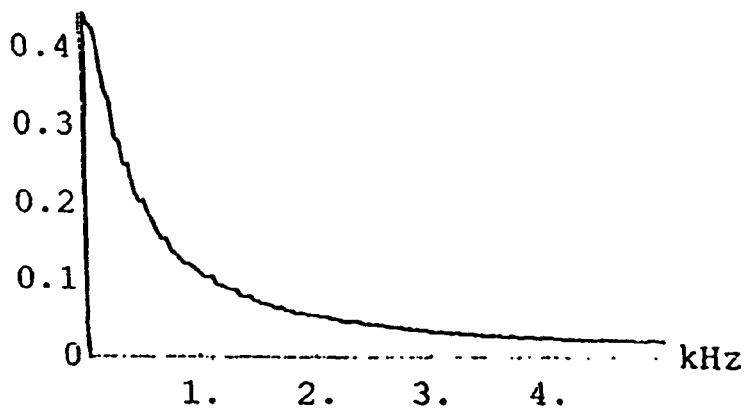
FIGS. 7 and 8 show amplitude and phase functions, respectively, derived from the waveform of FIG. 5.
Figure 8:
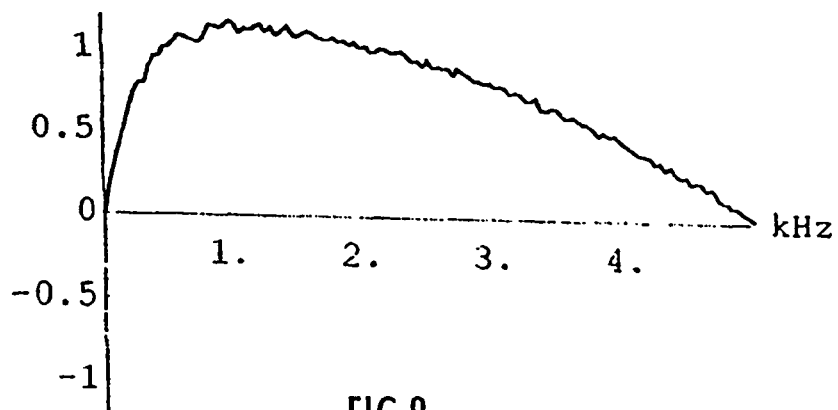

From mathematical manipulation of the waveforms, the impulse response function of the circuit, which is shown in FIG. 6, can be derived. By further manipulation, it is then possible to derive the complex transfer function of the circuit in amplitude-phase form. This is essentially a Bode-plot in non-logarithmic coordinates, showing the amplitude of the transfer function at every frequency in one plot, and the phase lead/lag in the other as shown in FIGS. 7 and 8 respectively.

These plots completely characterize the input/output relationships of the circuit under test. Any change whatsoever in the operation of the circuit which affects its input/output relationships must be reflected in some change in these plots. As a result, they are the ideal basis of comparison between the in situ measured response of a circuit and its known, good, expected response, which may be stored in ROM for comparison. In the preferred embodiment of the present instant invention, the raw impulse response of the known good system is neither stored nor compared directly. Instead, the data is compressed using the PCA algorithm as described above, and the position of the data points in the reduced dimensional space are compared using cluster analysis.

As will be appreciated from the above, in accordance with the present invention, a low level PRBS signal input is injected into a conducting structure, such as a cable. The correlation of the input with an output signal received from the cable gives the impulse response of the circuit. That impulse response completely characterizes the transfer function of the cable, including the analog properties of connectors as well as wires. This is a complete characterization of the transfer function of a cable (and any other included components), including its frequency and phase characteristics over a wide frequency range. If the cable changes due to a high resistance point, leakage, changing capacitance to a shield or to another conductor in the cable, its transfer function will change and is detected and diagnosed. Similarly, discontinuities which cause signal reflections and hence standing waves in the cable are detected and diagnosed. The method is independent of either signals or power on the cables, so the method can be used for on-line all-the-time testing or off-line testing.

The method provides a measure of the health of the cable, giving its actual transfer function. This allows prognostics as well as diagnostics to be performed. Consider a digital data cable where digital data may be transferring properly, but the cable is deteriorating due to carbonization which is reducing the analog bandwidth of the cable and increasing crosstalk with other wires in the cable bundle. The testing method of the present invention will detect this situation and, with appropriate built-in test hardware, will be able to test continually as the cable performs its normal function. External testing is also very feasible using the method of the present invention. Performing an FFT on the impulse response gives the circuit's complex transfer function, similar to a Bode plot and, therefore, gives its gain and phase characteristics at all frequencies of interest. If the cable deteriorates such that its transfer function changes, the impulse response must change and can be detected by comparing the nominal transfer function with the measured transfer function. The FFT is not necessary in accordance with the present invention. Furthermore, since the complete transfer function is produced, failures can often be diagnosed (as well as detected) by observing the details of the change in the transfer function from its nominal case. The low level PRBS signal that is used as the "probe" in the present invention can, in theory, be an arbitrarily small signal, even below the noise level of circuits on either side of the cable. This is possible because the resulting signal is averaged over relatively long times to obtain the result. The lower the signal level, the longer an averaging time is required but, in principal, the PRBS "probe" can be made sufficiently small that it cannot interfere with the operation of the cable, yet the complete transfer function of the cable can still be obtained. This is particularly effective when the cable is carrying low frequency signals such as power because the averaging necessary to separate the PRBS probe or input signal and the power will be very short, providing near real-time detection of faults.

The cross-correlation between the input and output contains enough information to detect chafing and other defects, and the cross-correlation can be formed using hardware without the need to acquire the input and output voltages directly (but only their products) and without the need for fast digitization of any signal. If the signal injected into the wire and the output signal are fed in to a controlled delay and multiplier, the time-average of the resulting signal will correspond to the value of the time-averaged correlation function for a particular input-output lag. The signal from the multiplier can be digitized at a much lower pace than the raw input and output signal because there is only interest in the time average. In fact, care should be taken not to sample too fast in that a correct estimate for the time average will only be obtained if two consecutive samples are at least one correlation time apart. For the signals used, the autocorrelation times are roughly one clock cycle, or $1/64$ MHz such that sampling can be at a pace dictated by the digitizing capability of a low-end microprocessor. For instance, if digitizing at 10K samples per second, the entire cross-correlation (averaged over five hundred PRBS-codes) could be constructed in about ten seconds.

The low level PRBS signal can be induced on wiring using an inductive loop or coil, eliminating the need to unplug a cable and connect directly to the cable to get the test signal onto the cable. If the coil has been selected properly, the PRBS generator will not be significantly loaded by the coil, and the delayed signal and the signal fed into the coil will contain essentially the same waveforms.

Figure 9:
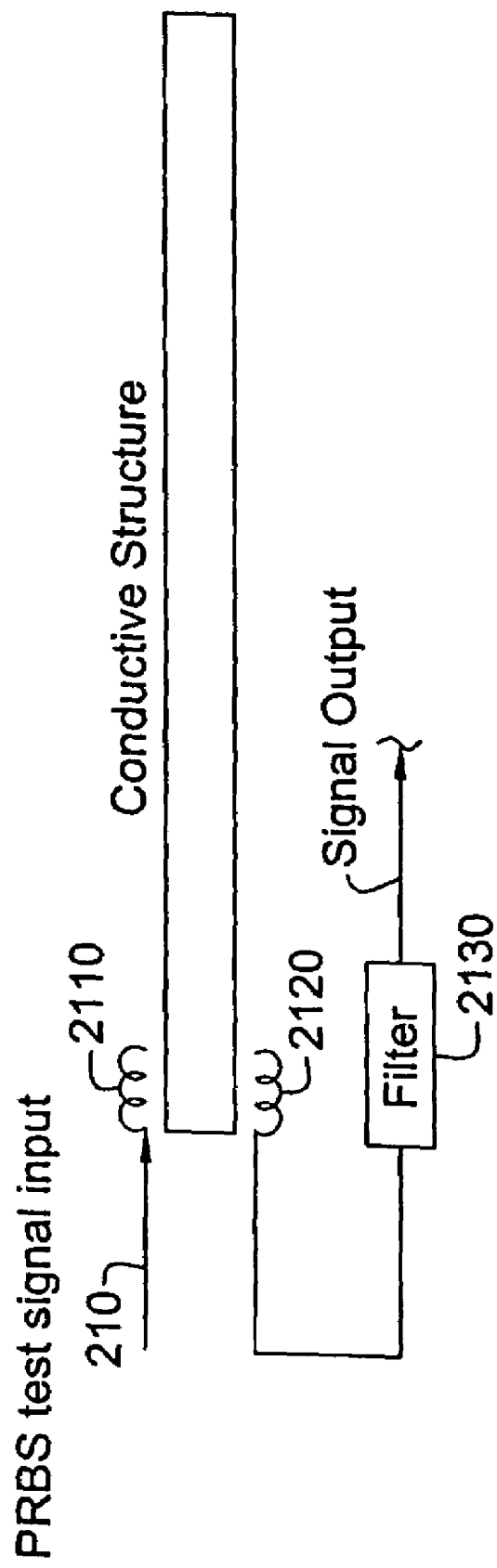
FIG. 9 is a diagram of a modification of the system of FIG. 1.

FIG. 9 shows the system of the present invention where the input coil 2110 and the output coil 2120 are coupled to the conducting structure 100 adjacent the same end thereof and also shows the insertion of a filter 2130 in the output line in the event the conducting structure is passing operating signals, such as 60 Hz power, therethrough as described above. While the coils are shown adjacent the conducting structures, the coils can also extend around the conducting structure, the primary consideration being the establishment of magnetic flux coupling.

Specific parameters need be considered (and the constraints on them) for optimal design of the coils, both for injecting the PRBS-code into the cable, and for picking up the signal. The parameters of the coil are its resistance R, its inductance L, the number of windings N, and the radius of each winding, r. The coils do not necessarily need to be looped around the conducting structure; holding the coils in close proximity to the conducting structure will provide coupling through magnetic flux.

For both injecting the PRBS signal and pickup of the output signal, the first consideration is the response time of the signal: the coil needs to be fast enough to deal with the 70 MHz clock cycle (and also with the rise time of the binary data, which is on the order of 5 ns) in the embodiment discussed herein. The response time $\tau$ of a coil is determined by its inductance, L, and its resistance, R: $\tau = L/R$. Thus, the constraint that $\tau = L/R << 1/70$ MHz. Considering the input coil, maximum flux should be injected into the cable. This means r should be as small as possible (snug fit around cable or wire bundle). The resistance of the coil should be as small as possible without shorting out the PRBS-code generator (i.e. produce maximum sustainable current).

The output coil also should fit snugly around the cable, and the number of windings should be large. As the number of windings increase, the voltage induced in the coil increases, and the induced current decreases. The optimal number of windings will be determined by the current requirements of the circuitry reading the output coil voltage. Preferably, the input and output coils will be integrated into one unit (but electro-magnetically isolated from one another) that can be simply hooked on a conducting structure.

Some applications where the method and system of the present invention are particularly effective include testing of wiring and cabling, particularly aircraft wiring, for chafing or insulation defects, detecting defects, such as cracks, corrosion and abrasion, and/or leaks in piping, detecting leaks in piping and detecting anomalies in various elongate conducting structures, such as fencing breaches.

Inasmuch as the present invention is subject to many variations, modifications and changes in detail, it is intended that all subject matter discussed above or shown in the accompanying drawings be interpreted as illustrative only and not be taken in a limiting sense.

What is claimed is:

1. A system for non-destructive evaluation of an elongated conducting structure comprising
a generator supplying a series of high frequency input signals to the conducting structure, said input signals having a frequency of at least 3 MHz;
means providing a time delayed replica of each of said input signals;
an analog multiplier receiving an output signal from the conducting structure in response to each of said input signals, receiving said time delayed replica of each of said input signals and producing a multiplication output thereof;
a sample and hold circuit receiving said multiplication output and supplying unsynchronized samples forming an impulse response function output;
an analog-to-digital converter receiving said sample and hold circuit output; and
a data processor receiving an input from said analog-to-digital converter to produce an average signal from a fixed number of samples, to initiate successive series of input signals and time delayed replicas of each input signal with increasing time delays and to produce an average signal from each successive time delay of said time delayed replicas of said input signals creating, in aggregate, the impulse function of the conducting structure.

2. The system for non-destructive evaluation of an elongated conducting structure recited in claim 1 wherein said data processor means includes means for performing principle component analysis of said impulse response.

3. The system for non-destructive evaluation of a an elongated conducting structure recited in claim 2 wherein said input signals are PRBS signals.

4. The system for non-destructive evaluation of an elongated conducting structure recited in claim 3 wherein said PRBS signals have a frequency greater than 20 MHz.

5. The system for non-destructive evaluation of an elongated conducting structure recited in claim 1 and further comprising an input inductive device for coupling said input signals to said conducting structure.

6. The system for non-destructive evaluation of an elongated conducting structure recited in claim 5 and further comprising an output device disposed adjacent said input inductive device for detecting said output signal from said conducting structure.

7. The system for non-destructive evaluation of an elongated conducting structure recited in claim 1 wherein said generator means includes shift register means supplying said input signals and said time delayed replicas of said input signals.

8. A method for non-destructive evaluation of an elongated conducting structure comprising the steps of
supplying a series of high frequency input signals having a frequency of at least 3 MHz to the elongated conducting structure;
deriving a series of output signals from the elongated conducting structure, each output signal corresponding to one of the input signals;
generating a time delayed replica of each of the series of high frequency input signals;
multiplying the time delayed replica input signals and the output signals to produce a multiplication signal;
sampling the multiplication signal at unsynchronized discrete points in time to produce an impulse response function;
converting the impulse response function to a digital signal; and
processing the digital signal to produce average signals from at least first and second time delayed series of generated signals.

9. The method for non-destructive evaluation of an elongated conducting structure recited in claim 8 wherein said processing step includes principle component analysis, a clustering algorithm and a final diagnosis algorithm.

10. The method for non-destructive evaluation of an elongated conducting structure recited in claim 8 wherein said supplying step includes supplying PRBS input signals.

11. The method for non-destructive evaluation of an elongated conducting structure recited in claim 10 wherein said supplying step includes supplying PRBS signals having a frequency greater than 20 MHz.

12. The method for non-destructive evaluation of an elongated conducting structure recited in claim 10 wherein said supplying step includes supplying PRBS signals having a frequency range between a few to hundreds of MHz.

* * * * *